(12) United States Patent
Jin

(10) Patent No.: US 10,263,048 B2
(45) Date of Patent: Apr. 16, 2019

(54) PIXEL ARRANGEMENT STRUCTURE

(71) Applicant: Shenzhen China Star Optoelectronics Technology Co., Ltd., Shenzhen (CN)

(72) Inventor: Yufeng Jin, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 156 days.

(21) Appl. No.: 15/508,100

(22) PCT Filed: Feb. 15, 2017

(86) PCT No.: PCT/CN2017/073599
§ 371 (c)(1),
(2) Date: Mar. 1, 2017

(87) PCT Pub. No.: WO2018/120366
PCT Pub. Date: Jul. 5, 2018

(65) Prior Publication Data
US 2018/0226457 A1    Aug. 9, 2018

(30) Foreign Application Priority Data
Dec. 29, 2016   (CN) .......................... 2016 1 1244123

(51) Int. Cl.
*G09G 3/20*      (2006.01)
*G09G 3/36*      (2006.01)
*H01L 27/32*     (2006.01)
*G09G 3/3208*    (2016.01)

(52) U.S. Cl.
CPC ....... *H01L 27/3218* (2013.01); *G09G 3/2003* (2013.01); *H01L 27/3213* (2013.01); *G09G 3/3208* (2013.01); *G09G 3/3607* (2013.01); *G09G 2300/0452* (2013.01); *G09G 2330/021* (2013.01); *G09G 2340/0457* (2013.01)

(58) Field of Classification Search
CPC . G09G 3/3607; G09G 3/2074; H01L 27/3218
See application file for complete search history.

(56) References Cited

U.S. PATENT DOCUMENTS

| 8,179,365 | B2 * | 5/2012 | Lee ........................ G09G 3/344 345/107 |
| 2009/0109172 | A1 | 4/2009 | Lee |
| 2016/0042704 | A1 * | 2/2016 | Yin ........................... G06T 5/20 345/695 |

* cited by examiner

*Primary Examiner* — Jose R Diaz
(74) *Attorney, Agent, or Firm* — Leong C. Lei

(57) ABSTRACT

The present invention provides a pixel arrangement structure, comprising a plurality of pixel units, and each pixel unit comprising a first sub pixel, a second sub pixel, a third sub pixel and a fourth sub pixel, and the fourth sub pixel being a triangle, and the first sub pixel, the second sub pixel and the third sub pixel being respectively arranged around the fourth sub pixel, and respectively sharing three sides with the fourth sub pixel. The pixel arrangement structure of the present invention adds the white sub pixel to promote the transmission rate of the panel, and to reduce the energy consumption of the display, and meanwhile to be beneficial for implementation of the sub pixel rendering algorithm to promote the virtual resolution.

7 Claims, 3 Drawing Sheets

PIXEL ARRANGEMENT STRUCTURE

FIELD OF THE INVENTION

The present invention relates to a display technology field, and more particularly to a pixel arrangement structure.

BACKGROUND OF THE INVENTION

The LCD (Liquid Crystal Display) possesses many advantages of being ultra thin, power saved and radiation free. It has been widely utilized in, such as mobile phones, Personal Digital Assistant (PDAs), digital cameras, laptop screens or notebook screens.

Most of the liquid crystal displays on the present market are back light type liquid crystal displays, which comprise a liquid crystal display panel and a back light module. The working principle of the liquid crystal display panel is to locate liquid crystal molecules between two parallel glass substrates, and a plurality of vertical and horizontal tiny electrical wires are between the two glass substrates. The light of back light module is reflected to generate images by applying driving voltages to control whether the liquid crystal molecules to be changed directions.

The OLED (Organic Light-Emitting Diode) display, which is also named as the Organic light emitting display, is a new flat panel display device. Because it possesses advantages of simple manufacture process, low cost, low power consumption, high light emitting brightness, wide operating temperature range, thin volume, fast response speed, and being easy to achieve the color display and the large screen display, and being easy to achieve the match with the integrated circuit driver, and being easy to achieve the flexible display. Therefore, it has the broad application prospects.

The OLED can be categorized into two major types according to the driving ways, which are the Passive Matrix OLED (PMOLED) and the Active Matrix OLED (AMOLED), i.e. two types of the direct addressing and the Thin Film Transistor matrix addressing. The AMOLED comprises pixels arranged in array and belongs to active display type, which has high lighting efficiency and is generally utilized for the large scale display devices of high resolution.

The pixel arrangement structures of the liquid crystal display panel and the OLED display panel according to prior art generally comprise a plurality of repetitive pixel units. Each pixel unit comprises a red sub pixel, a green sub pixel and a blue sub pixel which are arranged in order. However, with the development of panel optimization display algorithm, the requirements for the panel pixels (Pixel) are getting higher and higher. There is a big difference for the perception of the colors or the effect of the virtual resolution in the different arrangements.

SUMMARY OF THE INVENTION

An objective of the present invention is to provide a pixel arrangement structure capable of promoting the transmission rate of the panel, and reducing the energy consumption of the display, and meanwhile being beneficial for implementation of the sub pixel rendering algorithm to promote the virtual resolution.

For realizing the aforesaid objective, the present invention provides a pixel arrangement structure, comprising a plurality of pixel units, and each pixel unit comprising a first sub pixel, a second sub pixel, a third sub pixel and a fourth sub pixel, and the fourth sub pixel being a triangle, and the first sub pixel, the second sub pixel and the third sub pixel being respectively arranged around the fourth sub pixel, and respectively sharing three sides with the fourth sub pixel.

The fourth sub pixel is an equilateral triangle, and the first sub pixel, the second sub pixel and the third sub pixel are pentagons, and shapes and sizes thereof are exactly the same.

The fourth sub pixel comprises a first side shared with the first sub pixel, a second side shared with the second sub pixel, and a third side shared with the third sub pixel;

the first sub pixel comprises the first side, a fourth side and a fifth side which are respectively perpendicular with and connected with two end points of the first side, and a sixth side and a seventh side which are respectively connected to the other end points of the fourth side and the fifth side, and the sixth side and the seventh side have a common end point, and lengths of the fourth side, the fifth side, the sixth side and the seventh side are equal, and a length of the first side is $\sqrt{3}$ times of the length of the fourth side.

The plurality of pixel units are arranged in a plurality of rows and a plurality of columns, in which orientations of the two adjacent pixel units are inverted with each other in each row of the pixel units, and orientations of all the pixel units are the same in each column of the pixel units.

In each row of the pixel units and in each column of the pixel units, the two adjacent pixel units share a boundary, in which there is no gap between the two adjacent pixel units.

The fourth sub pixel is a white sub pixel, and the first sub pixel, the second sub pixel and the third sub pixel respectively are any one of a red sub pixel, a green sub pixel, and a blue sub pixel, and colors of the first sub pixel, the second sub pixel and the third sub pixel are different.

The present invention further provides a pixel arrangement structure, comprising a plurality of pixel units, and each pixel unit comprising a first sub pixel, a second sub pixel, a third sub pixel and a fourth sub pixel, and the fourth sub pixel being a triangle, and the first sub pixel, the second sub pixel and the third sub pixel being respectively arranged around the fourth sub pixel, and respectively sharing three sides with the fourth sub pixel;

wherein the fourth sub pixel is an equilateral triangle, and the first sub pixel, the second sub pixel and the third sub pixel are pentagons, and shapes and sizes thereof are exactly the same;

wherein the fourth sub pixel is a white sub pixel, and the first sub pixel, the second sub pixel and the third sub pixel respectively are any one of a red sub pixel, a green sub pixel, and a blue sub pixel, and colors of the first sub pixel, the second sub pixel and the third sub pixel are different.

The benefits of the present invention are: the present invention provides a pixel arrangement structure. The white sub pixel is added to promote the transmission rate of the panel, and to reduce the energy consumption of the display, and meanwhile to be beneficial for implementation of the sub pixel rendering algorithm to promote the virtual resolution.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
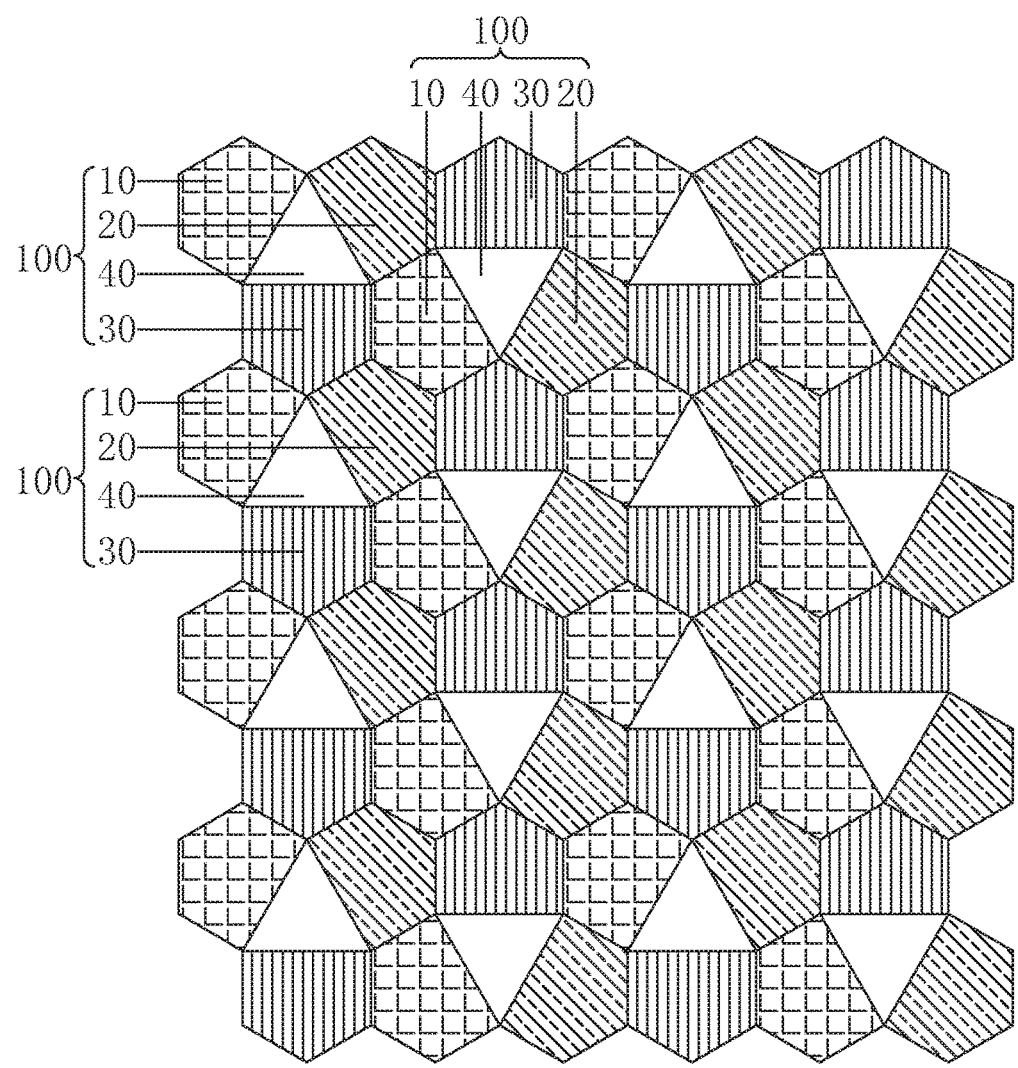
FIG. 1 is a structure diagram of a pixel arrangement structure of the present invention.
Figure 2:
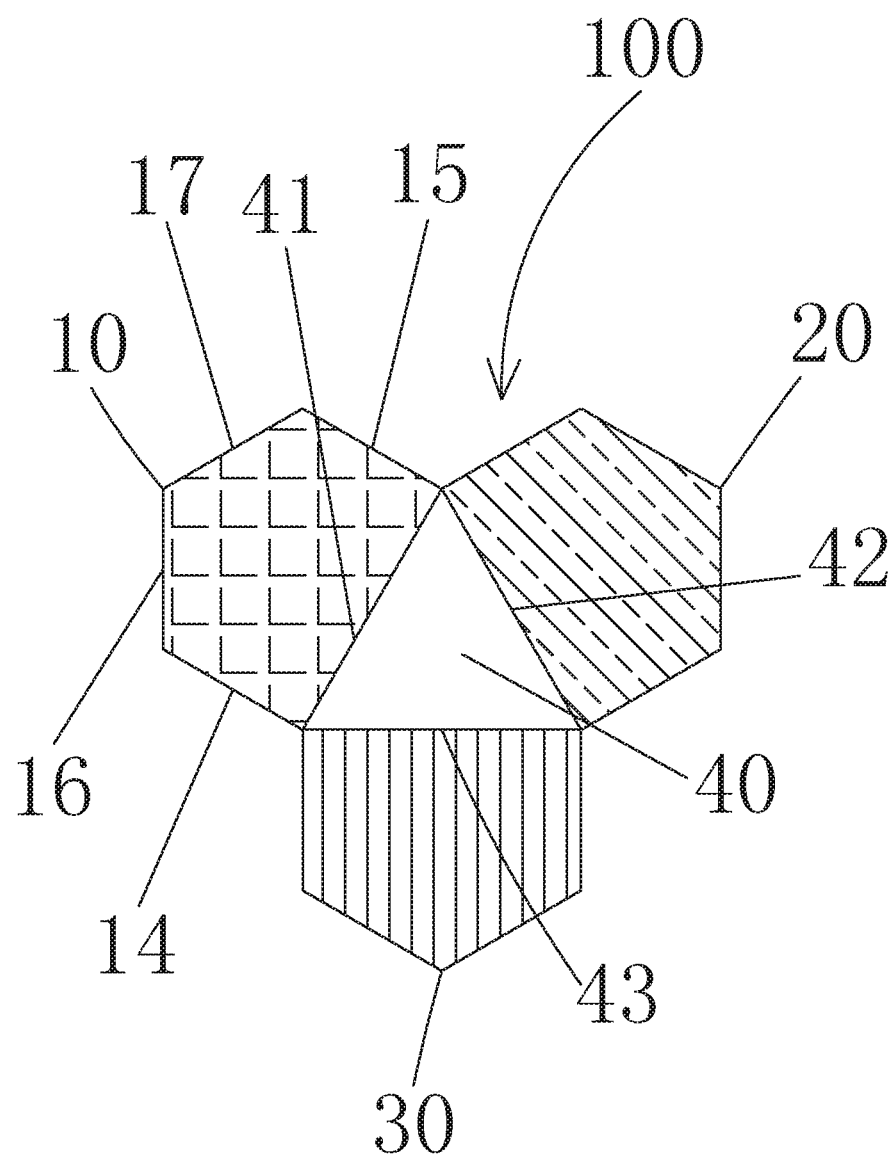
FIG. 2 is a structure diagram of a pixel unit in the pixel arrangement structure of the present invention.

Please refer to FIG. 1 and FIG. 2. The present invention provides a pixel arrangement structure, comprising a plurality of pixel units 100, and each pixel unit 100 comprising a first sub pixel 10, a second sub pixel 20, a third sub pixel 30 and a fourth sub pixel 40, and the fourth sub pixel 40 being a triangle, and the first sub pixel 10, the second sub pixel 20 and the third sub pixel 30 being respectively arranged around the fourth sub pixel 40, and respectively sharing three sides with the fourth sub pixel 40.

The fourth sub pixel 40 is an equilateral triangle, and the first sub pixel 10, the second sub pixel 20 and the third sub pixel 30 are pentagons, and shapes and sizes thereof are exactly the same.

The fourth sub pixel 40 comprises a first side 41 shared with the first sub pixel 10, a second side 42 shared with the second sub pixel 20, and a third side 43 shared with the third sub pixel 30;

the first sub pixel 10 comprises the first side 41, a fourth side 14a and a fifth side 15 which are respectively perpendicular with and connected with two end points of the first side 41, and a sixth side 16 and a seventh side 17 which are respectively connected to the other end points of the fourth side 14 and the fifth side 15, and the sixth side 16 and the seventh side 17 have a common end point, and lengths of the fourth side 14, the fifth side 15, the sixth side 16 and the seventh side 17 are equal, and a length of the first side 41 is $\sqrt{3}$ times of the length of the fourth side 14.

The plurality of pixel units 100 are arranged in a plurality of rows and a plurality of columns, in which orientations of the two adjacent pixel units 100 are inverted with each other in each row of the pixel units 100, and orientations of all the pixel units 100 are the same in each column of the pixel units 100.

In each row of the pixel units 100 and in each column of the pixel units 100, the two adjacent pixel units 100 share a boundary, in which there is no gap between the two.

The fourth sub pixel 40 is a white sub pixel, and the first sub pixel 10, the second sub pixel 20 and the third sub pixel 30 respectively are any one of a red sub pixel, a green sub pixel, and a blue sub pixel, and colors of the first sub pixel 10, the second sub pixel 20 and the third sub pixel 30 are different.

Specifically, the pixel arrangement structure of the present invention adds the white sub pixel to promote the transmission rate of the panel, and to reduce the energy consumption of the display.

When the pixel arrangement of the present invention is applied for the sub pixel rendering (SPR) algorithm, one or more sub pixels of one pixel unit 100 in the pixel arrangement can maximally borrow the sub pixels in the pixel units 100 around to composite a new pixel unit, and thus the present invention is beneficial for implementation of the sub pixel rendering algorithm to promote the virtual resolution.

Figure 3:
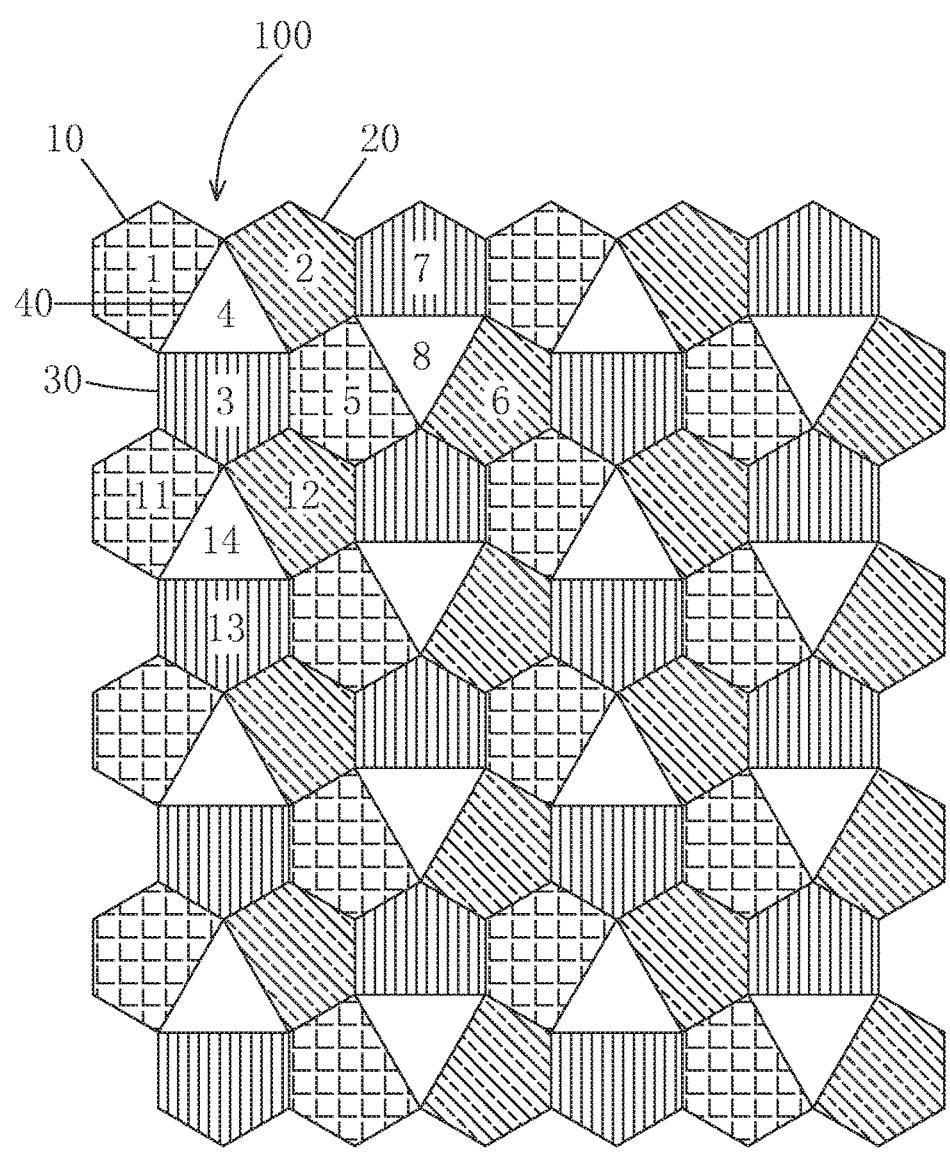
FIG. 3 is an identification diagram as the pixel arrangement structure of the present invention is applied for the sub pixel rendering algorithm.

As shown in FIG. 3, for one pixel unit 100 composited with the sub pixels 1, 2, 3, 4 (respectively corresponding to the first sub pixel 10, the second sub pixel 20, the third sub pixel 30 and the fourth sub pixel 40), the sub pixels 2, 3, 4 of the pixel unit 100 can horizontally borrow the sub pixel 5 of the adjacent pixel unit 100 (corresponding to the first sub pixel 10) to form a new pixel unit composited with the sub pixels 2, 3, 4, 5. The sub pixels 1, 2, 4 of the pixel unit 100 can horizontally borrow the sub pixel 7 of the adjacent pixel unit 100 (corresponding to the third sub pixel 30) to form a new pixel unit composited with the sub pixels 1, 2, 4, 7. The sub pixels 2, 4 of the pixel unit 100 can horizontally borrow the sub pixels 5, 7 of the adjacent pixel unit 100 to form a new pixel unit composited with the sub pixels 2, 4, 5, 7;

Besides, the sub pixels 2, 3, 4 of the pixel unit 100 can vertically borrow the sub pixel 11 of the adjacent pixel unit 100 (corresponding to the first sub pixel 10) to form a new pixel unit composited with the sub pixels 2, 3, 4, 11. The sub pixels 1, 3, 4 of the pixel unit 100 can vertically borrow the sub pixel 12 of the adjacent pixel unit 100 (corresponding to the second sub pixel 20) to form a new pixel unit composited with the sub pixels 2, 3, 4, 12. The sub pixels 3, 4 of the pixel unit 100 can vertically borrow the sub pixels 11, 12 of the adjacent pixel unit 100 to form a new pixel unit composited with the sub pixels 3, 4, 11, 12.

In conclusion, the pixel arrangement structure of the present invention adds the white sub pixel to promote the transmission rate of the panel, and to reduce the energy consumption of the display, and meanwhile to be beneficial for implementation of the sub pixel rendering algorithm to promote the virtual resolution.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A pixel arrangement structure, comprising a plurality of pixel units, and
    each pixel unit comprising a first sub pixel, a second sub pixel, a third sub pixel and a fourth sub pixel, and
    the fourth sub pixel being a triangle, and
    the first sub pixel, the second sub pixel and the third sub pixel being respectively arranged around the fourth sub pixel, and respectively sharing three sides with the fourth sub pixel;
    wherein the fourth sub pixel is an equilateral triangle, and
    the first sub pixel, the second sub pixel and the third sub pixel are pentagons, and shapes and sizes thereof are exactly the same;
    wherein the fourth sub pixel comprises a first side shared with the first sub pixel, a second side shared with the second sub pixel, and a third side shared with the third sub pixel;
    the first sub pixel comprises the first side, a fourth side and a fifth side which are respectively perpendicular with and connected with two end points of the first side, and a sixth side and a seventh side which are respectively connected to the other end points of the fourth side and the fifth side, and
    the sixth side and the seventh side have a common end point, and lengths of the fourth side, the fifth side, the sixth side and the seventh side are equal, and a length of the first side is √3 times of the length of the fourth side.

2. The pixel arrangement structure according to claim 1, wherein the plurality of pixel units are arranged in a plurality of rows and a plurality of columns, in which orientations of the two adjacent pixel units are inverted with each other in each row of the pixel units, and orientations of all the pixel units are the same in each column of the pixel units.

3. The pixel arrangement structure according to claim 2, wherein in each row of the pixel units and in each column of the pixel units, the two adjacent pixel units share a boundary, in which there is no gap between the two adjacent pixel units.

4. The pixel arrangement structure according to claim 1, wherein the fourth sub pixel is a white sub pixel, and the first sub pixel, the second sub pixel and the third sub pixel respectively are any one of a red sub pixel, a green sub pixel, and a blue sub pixel, and colors of the first sub pixel, the second sub pixel and the third sub pixel are different.

5. A pixel arrangement structure, comprising a plurality of pixel units, and each pixel unit comprising a first sub pixel, a second sub pixel, a third sub pixel and a fourth sub pixel, and the fourth sub pixel being a triangle, and the first sub pixel, the second sub pixel and the third sub pixel being respectively arranged around the fourth sub pixel, and respectively sharing three sides with the fourth sub pixel;

wherein the fourth sub pixel is an equilateral triangle, and the first sub pixel, the second sub pixel and the third sub pixel are pentagons, and shapes and sizes thereof are exactly the same;

wherein the fourth sub pixel is a white sub pixel, and the first sub pixel, the second sub pixel and the third sub pixel respectively are any one of a red sub pixel, a green sub pixel, and a blue sub pixel, and colors of the first sub pixel, the second sub pixel and the third sub pixel are different;

wherein the fourth sub pixel comprises a first side shared with the first sub pixel, a second side shared with the second sub pixel, and a third side shared with the third sub pixel;

the first sub pixel comprises the first side, a fourth side and a fifth side which are respectively perpendicular with and connected with two end points of the first side, and a sixth side and a seventh side which are respectively connected to the other end points of the fourth side and the fifth side, and the sixth side and the seventh side have a common end point, and lengths of the fourth side, the fifth side, the sixth side and the seventh side are equal, and a length of the first side is √3 times of the length of the fourth side.

6. The pixel arrangement structure according to claim 5, wherein the plurality of pixel units are arranged in a plurality of rows and a plurality of columns, in which orientations of the two adjacent pixel units are inverted with each other in each row of the pixel units, and orientations of all the pixel units are the same in each column of the pixel units.

7. The pixel arrangement structure according to claim 6, wherein in each row of the pixel units and in each column of the pixel units, the two adjacent pixel units share a boundary, in which there is no gap between the two adjacent pixel units.

\* \* \* \* \*